(12) United States Patent
Blodgett

(10) Patent No.: US 6,888,748 B2
(45) Date of Patent: May 3, 2005

(54) PROGRAMMABLE CIRCUIT AND ITS METHOD OF OPERATION

(75) Inventor: Greg A. Blodgett, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/613,066

(22) Filed: Jul. 7, 2003

(65) Prior Publication Data

US 2004/0052118 A1 Mar. 18, 2004

Related U.S. Application Data

(62) Division of application No. 09/977,288, filed on Oct. 16, 2001, now Pat. No. 6,606,264, which is a continuation of application No. 09/618,459, filed on Jul. 18, 2000, now Pat. No. 6,327,178.

(51) Int. Cl.$^7$ .............................................. G11C 11/40
(52) U.S. Cl. ......................... 365/177; 365/104; 326/35; 326/44
(58) Field of Search .......................... 365/94, 103, 104, 365/177; 326/35, 36, 44, 45, 49, 50

(56) References Cited

U.S. PATENT DOCUMENTS

| | | | |
|---|---|---|---|
| 4,333,164 A | 6/1982 | Orikabe et al. ............. | 365/104 |
| 4,384,345 A | 5/1983 | Mikome ...................... | 365/104 |
| 4,605,872 A | 8/1986 | Rung ......................... | 327/525 |
| 4,720,816 A | 1/1988 | Matsuoka et al. .......... | 365/104 |
| 4,937,787 A | 6/1990 | Kobatake ................... | 365/104 |
| 5,200,919 A | 4/1993 | Kaya ....................... | 365/185.24 |
| 5,303,184 A | 4/1994 | Noda ......................... | 365/104 |
| 5,394,362 A | 2/1995 | Banks ................... | 365/189.01 |
| 5,426,605 A | 6/1995 | Van Berkel et al. ........ | 365/104 |
| 5,448,187 A | 9/1995 | Kowalski ..................... | 326/81 |
| 5,463,579 A | 10/1995 | Shimoji .................. | 365/185.01 |
| 5,506,431 A | 4/1996 | Thomas .................. | 365/185.15 |
| 5,745,401 A | 4/1998 | Lee ............................. | 365/104 |
| 5,768,191 A | 6/1998 | Choi et al. ............. | 365/185.03 |
| 5,831,894 A | 11/1998 | Chang ......................... | 365/104 |
| 5,834,813 A | 11/1998 | Ma et al. ..................... | 257/368 |
| 5,835,406 A | 11/1998 | Chevallier et al. ..... | 365/185.03 |
| 5,838,040 A | 11/1998 | Salter, III et al. ........... | 257/321 |
| 5,862,074 A | 1/1999 | Park ..................... | 365/185.03 |
| 5,883,835 A | 3/1999 | Kodama ................ | 365/185.28 |
| 5,886,925 A | 3/1999 | Campardo et al. ....... | 365/185.2 |
| 5,896,316 A | 4/1999 | Toyoda .................. | 365/185.28 |
| 5,907,517 A | 5/1999 | Komarek et al. ........... | 365/210 |
| 6,031,760 A | * 2/2000 | Sakui et al. ........... | 365/185.21 |
| 6,044,006 A | 3/2000 | Von Basse et al. ......... | 365/104 |
| 6,178,114 B1 | 1/2001 | Yang ....................... | 365/185.2 |
| 6,330,190 B1 | 12/2001 | Wang et al. ........... | 365/185.28 |
| 6,690,610 B2 | * 2/2004 | Santin ..................... | 365/225.7 |

OTHER PUBLICATIONS

*Troutman, R. R., Abstract No. B79017617, C79012689, FET programmable read–only memory, IBM Technical Disclosure Bulletin, vol. 21, No. 4, pp. 1374–6, Sep. 1978.
*FET Programmable Read Only Memory, IBM Technical Disclosure Bull tin, pp. 1374–1376, Sep. 1978.

* cited by examiner

Primary Examiner—Tan T. Nguyen
(74) Attorney, Agent, or Firm—Dickstein Shapiro Morin & Oshinsky LLP

(57) ABSTRACT

A programmable circuit and its method of operation are disclosed in which a transistor is used as a programmable element. The transistor may be programmed to one of two different gate threshold voltage values for operation. During reading of the transistor, a gate threshold voltage between the two values is applied and the status of the transistor as on or off is determined to determine the program state of the transistor. The program state of the transistor can be determined by a simple latch circuit.

8 Claims, 3 Drawing Sheets

PROGRAMMABLE CIRCUIT AND ITS METHOD OF OPERATION

CROSS REFERENCE TO RELATED APPLICATIONS

The present application is a divisional application of U.S. patent application Ser. No. 09/977,288, filed on Oct. 16, 2001, now U.S. Pat. No. 6,606,264 which in turn is a continuation of U.S. patent application Ser. No. 09/618,459, filed Jul. 18, 2000 (now U.S. Pat. No. 6,327,178, issued on Dec. 4, 2001), the disclosures of which are herewith incorporated by reference in their entirety.

One of the ways to implement a programmable feature on an integrated circuit is by utilizing fuses or antifuses. Fuses are selectively electrically programmed by applying a program voltage which opens a circuit between two conductive terminals of the fuse. For laser fuses, a laser is used to cut a fuse link. An antifuse is electrically programmed by applying a programming voltage to break down dielectric material connected to two conductive terminals of the antifuse.

The programming voltage permanently changes either the fuse or antifuse to provide a high or low resistance in accordance with the programming. In the case of an antifuse, the high resistance is typically a program resistance on the order of hundreds of thousand ohms.

The programming voltage for a fuse or antifuse is typically quite high, for example, over 8 volts. This high voltage must be routed to selective fuse or antifuse elements on an integrated circuitry without affecting other highly sensitive lower voltage signal paths. Accordingly, the introduction of high fuse or antifuse programming voltages requires careful design and process modifications, such as tailored junction profiles or thick gate oxides in order to avoid damage to other sensitive components on the integrated circuit die. This increases fabrication complexity as well as chip size.

A programmable circuit which relies on a lower programming voltage and decreased die area for the programmable element would be desirable.

Also, in the testing of DRAM memory devices utilizing boosted wordline voltages, a Vt shift of several hundred millivolts has inadvertently been produced in small n-channel transistors in the memory array. This causes the affected memory cells to be inferior since the data to be stored in the cell is not as readily transferred through the affected n-channel access device. To avoid this detrimental effect, device manufacturing processes have been modified. This invention utilizes this effect which is detrimental to the memory array, for an improved programmable circuit element outside of the memory array.

SUMMARY OF THE INVENTION

The present invention provides a programmable circuit which relies on a programmable transistor in which the gate threshold voltage for turning the transistor on is programmable. The gate threshold voltage may be programmed to be either a first voltage or a second voltage. The program state of the transistor can be determined by applying a gate threshold voltage between the first and second gate threshold voltages and then determining the operative state, i.e., on or off, of the transistor.

One of the first and second gate threshold voltages for the transistor can be selected as the normal gate threshold operating voltage for the transistor, while the other gate threshold voltage can be set by applying suitable voltages to the gate and drain electrodes of the transistor to thereby alter the gate threshold voltage to a second value away from the normal gate threshold voltage. The programming voltage for the gate and drain are lower than voltage typically used to program a fuse or antifuse element.

The programming circuit of the invention has particular utility in any integrated circuit which requires a programmable element and has particular utility in the field of DRAMs as a replacement for a fuse or antifuse element.

The above advantages and features of the invention will be more clearly understood from the following detailed description which is provided in connection with the accompanying drawings.

DETAILED DESCRIPTION OF THE PREFERRED EMBODIMENTS

Figure 1:
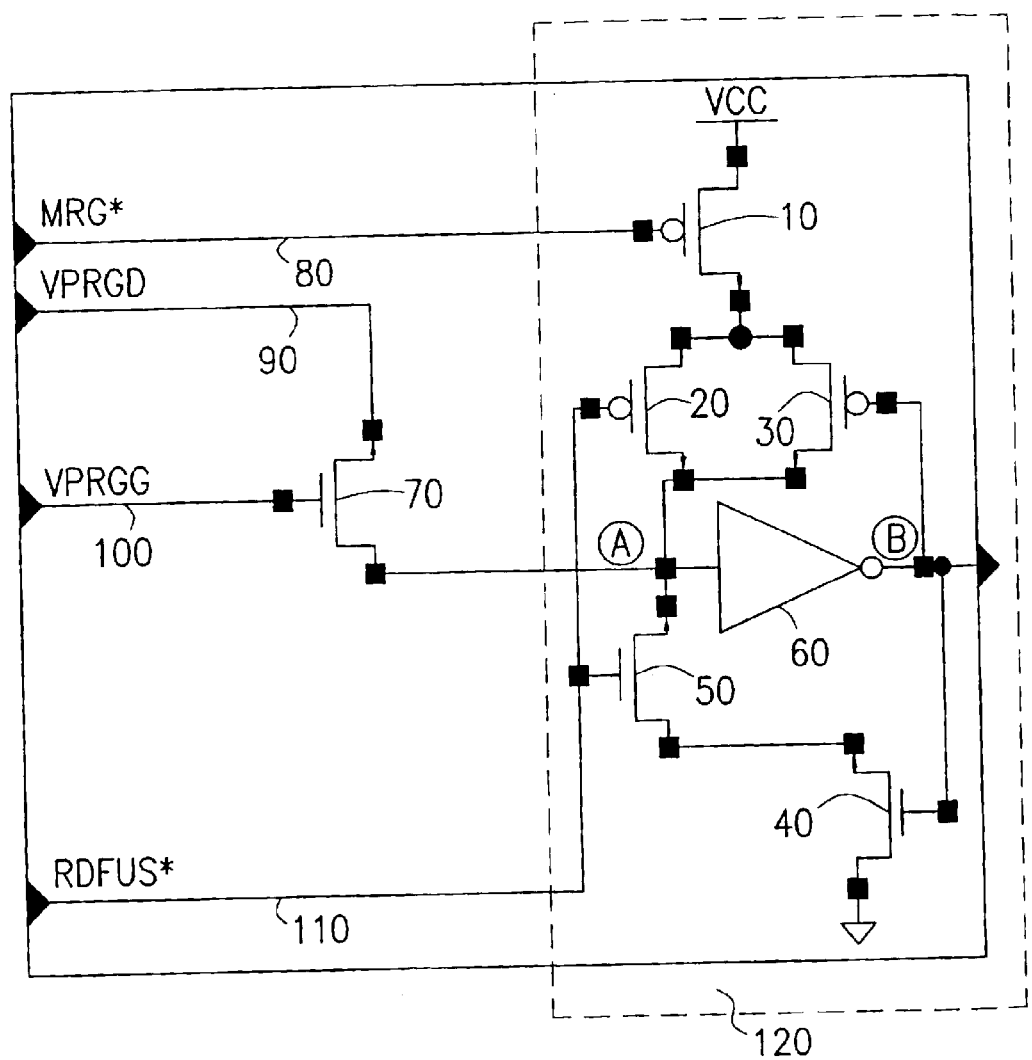
FIG. 1 illustrates a programmable circuit in an exemplary embodiment of the invention.
Figure 2:
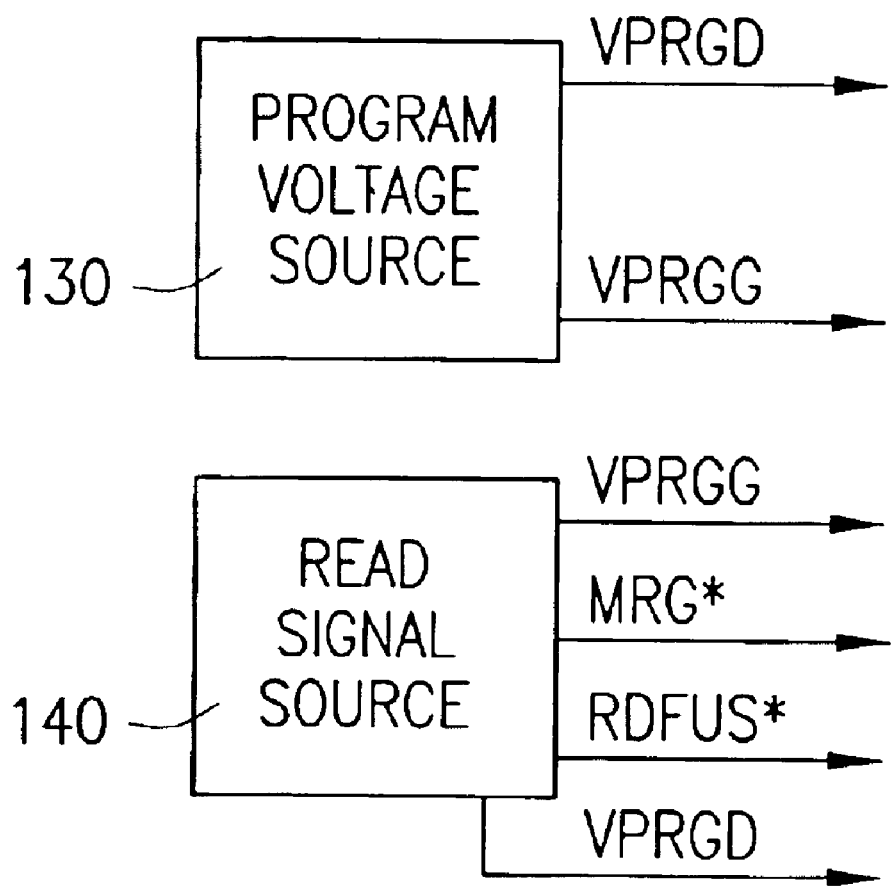
FIG. 2 illustrates signal sources for providing the operative signals for the FIG. 1 circuit.

An exemplary embodiment of the invention is illustrated in FIGS. 1 and 2. FIG. 1 illustrates a programmable transistor 70 illustrated as an n-channel transistor which has its gate coupled to a programming signal line VPRGG 100 and its drain coupled to another programming signal line VPRGD 90. As fabricated, transistor 70 has a normal gate operating threshold voltage Vt, e.g. 0.7 v. The gate threshold operating voltage Vt can be changed by programming on the signal lines 90 and 100. For example, if the normal gate threshold Vt for transistor 70 is 0.7 v, the application of a programming voltage on the signal lines 90 and 100 to the drain and gate terminals respectively can change this threshold voltage Vt to another higher value, e.g. 1.5 v.

If, for example, 6 volts is applied to the gate via signal line 100 and 4.5 volts is applied to the drain via signal line 90, and a substrate bias voltage Vbb in which the circuit of FIG. 1 is fabricated is lowered from a value in the range of −0.6 to −1.0 volts, to a value of −2.0 volts, and this condition is maintained for approximately 5 seconds, the threshold voltage Vt of transistor 70 will permanently shift to approximately 1.5 volts. It is thought that this shift in threshold voltage is caused by charges being trapped in the gate of transistor 70 by the noted programming conditions. Accordingly, the gate threshold voltage of transistor 70 can remain at the original threshold voltage level Vt or can be programmed to a different substantially higher voltage level, e.g., approximately 2 Vt, thus establishing two possible gate threshold voltages for transistor 70.

The programmed state of programmable transistor 70, that is, whether it is operating with the initial gate threshold voltage Vt or with a substantially higher gate threshold voltage, can be determined by grounding line 90 and applying a gate threshold voltage on line 100, which is between the normal threshold voltage Vt and the higher gate threshold voltage, and then determining whether the transistor 70 is "on" or "off." If the transistor 70 was set at its normal voltage threshold Vt, a higher voltage threshold applied to the gate of transistor 70 on line 100 will cause transistor 70 to turn "on.". Likewise, if the voltage threshold for programmable transistor 70 has been changed to a higher value, then when a threshold voltage on line 100, which is between the original value Vt and the higher value, is applied, transistor 70 will remain "off" when line 90 is grounded. Thus, programmable transistor 70 provides a simple and convenient way of programming a programmable element which does not require the same magnitude of programming voltages as is required with a fuse or antifuse device.

FIG. 1 further illustrates a latch circuit 120 which is used to determine whether transistor 70 is "on" or "off," thus determining the state to which transistor 70 was programmed. Latch circuit 120 includes an input node A and an output node B, with the output node B supplying a signal indicating the program state of programmable transistor 70.

Input node A is connected to the source terminal of transistor 70, and an inverter 60 is connected between input node A and output node B of latch circuit 120. Latch circuit 120 further includes two p-channel transistors 20 and 30, with the sources of transistors 20 and 30 connected together and the drains of transistors 20 and 30 connected together. The sources of transistors 20 and 30 are, in turn, coupled to a voltage source Vcc through another p-channel transistor 10. The drains of transistors 20 and 30 are connected to node A.

Latch circuit 120 also includes two n-channel transistors 50 and 40 which are serially connected with the source of transistor 50 being connected to the drain of transistor 40, and with the transistors 40 and 50 being in turn serially connected between node A and ground. The gates of transistors 30 and 40 are connected to the output node B, while the gates of transistors 20 and 50 are connected to a read fuse RDFUS* (* denotes an active "low signal" line) signal line 110. Transistor 10 has its gate connected to a test margin control signal line MRG* 80.

FIG. 2 illustrates a program voltage source 130 which supplies signals to the VPRGD and VPRGG signal lines 90 and 100, respectively for programming transistor 70, and a read signal source 140 which supplies signals on the lines VPRGD, VPRGG, MRG* and RDFUS*, that is, to lines 90, 100, 80 and 110, respectively.

The programmable signal source 130 is operative to program transistor 70 to set the higher threshold voltage as needed or desired. Program voltage source 130 can be resident on an integrated circuit substrate containing the FIG. 1 circuit, or may be an external source which controls application of the programming signals on lines 90 and 100 via external terminals of the integrated circuit. Transistor 70 can be programmed during a testing state of an integrated circuit or, if external terminals of a packaged device are used to control the signals for lines 90, 100, by a user of the integrated circuit.

The read signal source 140 is resident on the integrated circuit containing the FIG. 1 circuit and provides the signals VPRGD, VPRGG, MRG* and RDFUS* during a read operation to ascertain the status of transistor 70. In particular, a gate threshold voltage is applied to the line VPRGG 100, which is between the original gate threshold voltage Vt and the higher threshold voltage which is set when programming signals are previously applied on lines 90 and 100, as described above. For example, if the higher gate threshold is approximately 2 Vt, when the applied gate threshold voltage during a read operation is between Vt and 2 Vt.

During the time that the gate threshold voltage is applied for a read operation to terminal 100, signal line 90 is grounded and the signal source 140 also applies the MRG* signal on line 80, which turns on transistor 10 and thereby applies power to the latch circuit 120. Note, MRG* may be set between Vcc minus a p-channel transistor Vt and 0 volts during normal operation. In a test mode it is lowered to provide a stronger pull up at node A to ensure adequate operating margin for the circuit. After power is applied, a signal is applied on line RDFUS* 110, which serves to turn on transistor 20 and turn off transistor 50. If at the time the RDFUS* signal is applied to turn on transistor 20, a voltage Vcc is produced at node A, then transistor 70 is turned "off." The voltage at node A is inverted by inverter 60 and is applied at output node B as a low voltage, e.g., "0" volts.

On the other hand, if when the RDFUS* signal is applied and turns on transistor 20, transistor 70 is also turned "on" by the gate threshold voltage VPRGG on line 100 and the grounding of line 90, then the Vcc voltage applied at node A will be diverted to ground through transistor 70 and the drain of transistor 70 and line 90. Thus, the voltage at node A will be at a low voltage, e.g., substantially "0" volts which, after inversion by inverter 60, will be seen at node B as a high output, e.g., as substantially Vcc.

When the voltage at terminal A goes to a high voltage and transistor 70 is off, the high voltage at node A will produce a low voltage at node B which is, in turn, supplied to transistor 30, causing it to turn on and hold the voltage at node A at the high voltage, and the voltage at node B at a low value. The low voltage at node B will maintain transistor 40 off, and thus the operative state of transistor 50 does not affect operation of the latch circuit 120.

If when transistor 20 is turned on and transistor 50 is turned off by the RDFUS* signal on line 110, and if at that time programmable transistor 70 is turned on, this produce a low voltage at node A which, in turn, produces a high voltage at node B. The high voltage at node B turns transistor 40 on and transistor 30 off and, when the RDFUS* returns to its normal high state this turns on transistor 50, which latches node A at the low voltage which, in turn, latches node B at the high voltage.

Thus, during a read operation, the state of output node B of latch circuit 120 reflects the operative state of transistor 70, i.e., "on" or "off," which in turn reflects the programmed state of programmable transistor 70.

The application of the read gate threshold voltage VPRGG at a level between the two possible threshold voltages for transistor 70 can be done at the same time the RDFUS* signal is applied to line 110.

The invention provides a simple expedient of a program transistor as a programmable element and a simple latch circuit to determine the state of the programmable element. The voltages required to program the transistors are much less than those required to program a fuse or antifuse element.

The programmable circuit of the invention may be used in an environment which requires the use of programmable elements in an analog or digital semiconductor circuit, including but not limited to logic circuits, processors, other programmable logic circuits, and memory devices. The invention may particularly be useful in memory devices as a programmable element for providing identification codes and/or programming to re-map defective memory cell addresses. In particular, DRAM devices where a boosted word line voltage has been known to inadvertantly produce Vf shifts in small n-channel transistors in the memory array. This boosted word line voltage may be used to generate either or both of the VPRGG and VPRGD signals.

Figure 3:
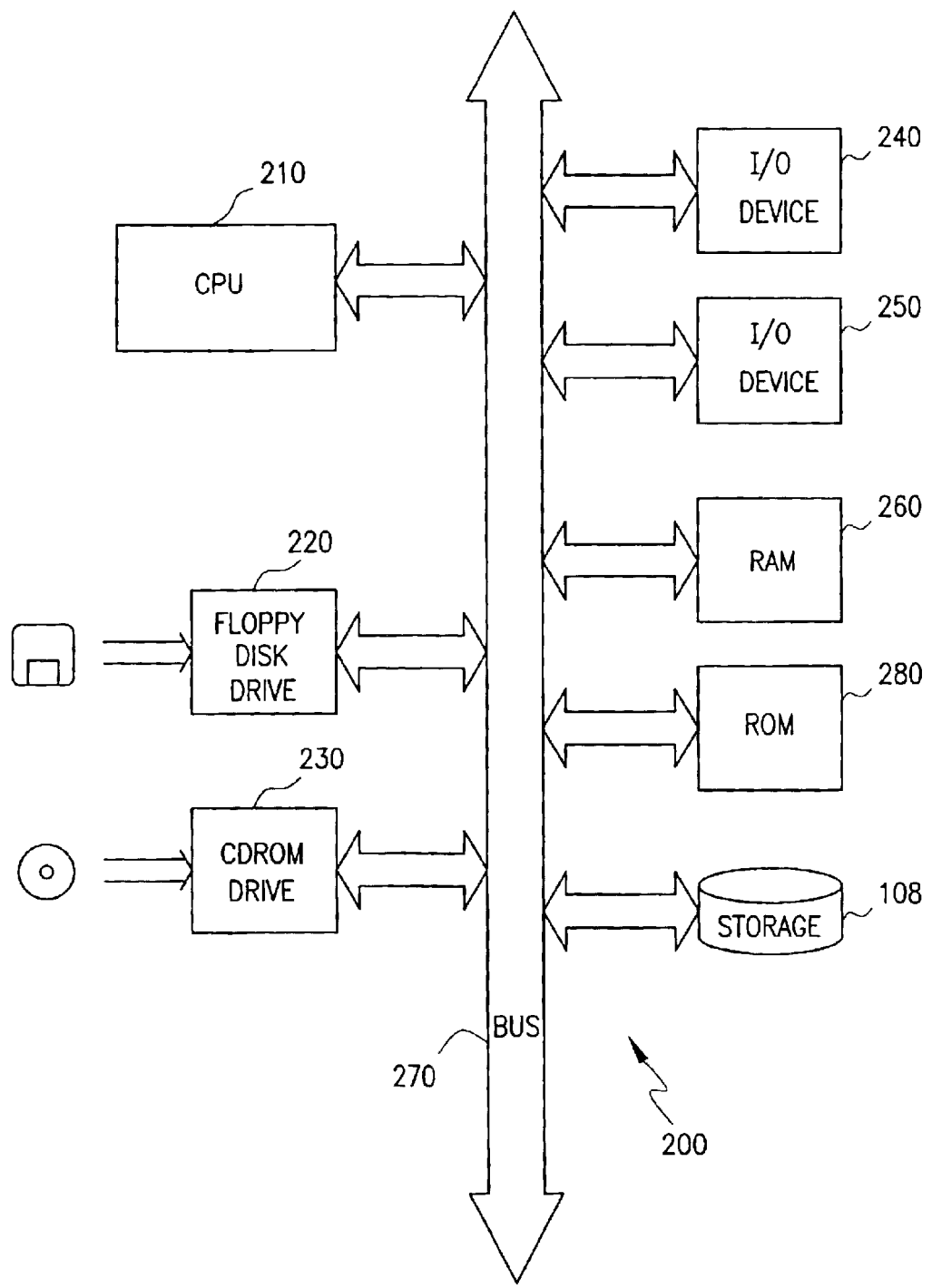
FIG. 3 illustrates a processor circuit which employs a memory device using the FIG. 1 circuit.

A processor system which may employ the programmable circuit of the invention is illustrated in FIG. 3. As shown in FIG. 3, the processor system, such as a computer system, for example, comprises a central processing unit (CPU) 210, for example, a microprocessor, that communicates with one or more input/output (I/O) devices 240, 250 over a bus 270. The computer system 200 also includes random access memory (RAM) 260, a read only memory (ROM) 280 and may include peripheral devices such as a floppy disk drive 220 and a compact disk (CD) ROM drive 230 which also communicates with CPU 210 over the bus 270. One or more of the RAM 260, CPU 210, ROM 280 may be constructed as an integrated circuit which includes the programmable transistor 70 and latch circuit 120 as described above. It may also be desirable to integrate the processor 210 and memory 260 on a single IC chip. Numerous other system configurations are possible which are fullly compatible with the present invention.

Although the invention has been described above in connection with exemplary embodiments, it is apparent that many modifications and substitutions can be made without departing from the spirit or scope of the invention. Accordingly, the invention is not to be considered as limited by the foregoing description, but is only limited by the scope of the appended claims.

What is claimed as new and desired to be protected by Letters Patent of the United States is:

1. A latching circuit comprising:
    a first p-channel transistor having a first drain, a first gate, and a first source, said first drain operatively connected to a source of a first supply voltage;
    second and third p-channel transistors having respective second and third drains, second and third gates, and second and third sources, said second and third drains mutually operatively connected to said first source;
    first and second n-channel transistors having respective fourth and fifth drains, fourth and fifth gates, and fourth and fifth sources, said fourth drain operatively connected to said second and third sources, said fourth source operatively connected to said fifth drain, said fifth source operatively connected to a source of a second ground voltage, said fourth gate operatively connected to said second gate;
    an inverter having an input operatively connected to said fourth drain and an input operatively connected to said third and fifth gates; and
    a third n-channel transistor having a sixth drain, a sixth gate, and a sixth source said sixth source operatively connected to said input of said inverter, said third n-channel transistor adapted to provide a conductive path between said sixth drain and said sixth source in response to a signal above a threshold magnitude applied at said sixth gate, wherein said third n-channel transistor is adapted to have said threshold magnitude adjusted in response to an electrical signal applied between said sixth drain and said sixth gate.

2. A method of forming a logical data storage device comprising:
    coupling a gate of a programmable threshold transistor to a first voltage node, said voltage node adapted to receive an electrical potential between a programmed gate threshold voltage and an unprogrammed gate threshold voltage of said programmable threshold transistor; and
    switchingly coupling an input of a latching circuit through said programmable threshold transistor to a second voltage node, said second voltage node adapted to be coupled to a source of substantially constant electrical potential.

3. A method of forming a logical data storage device as defined in claim 2, wherein said source of substantially constant electrical potential comprises a ground node.

4. A method of forming a logical data state storage device comprising:
    coupling a supply voltage node to a first source of a first field effect transistor, said first field effect transistor including a first drain;
    mutually coupling said first drain to respective second and third sources of a second and a third field effect transistor, said second and third field effect transistors having respective second and third drains;
    mutually coupling said second and third drains to one another and to an input of an inverter circuit and a fourth drain of a fourth field effect transistor, said fourth field effect transistor having a fourth source;
    coupling said fourth source to a fifth drain of a fifth field effect transistor, said fifth field effect transistor having a fifth source;
    coupling said fifth source to a ground node;
    coupling a first gate of said first field effect transistor to a first input node;
    mutually coupling a second gate of said second field effect transistor and a fourth gate of said fourth field effect transistor to a second input node;
    mutually coupling a third gate of said third field effect transistor and a fifth gate of said fifth field effect transistor to an output of said inverter circuit and a first output node;
    coupling said input of said inverter circuit to a sixth source of a sixth field effect transistor;
    coupling a sixth drain of said sixth field effect transistor to a ground node; and
    coupling a sixth gate of said sixth field effect transistor to a third input node.

5. A bi-stable logic device comprising:
    a switching device adapted to receive a gate signal during a first time interval, said gate signal having a magnitude within a range between a first threshold magnitude of said switching device and a second threshold magnitude of said switching device; and
    a latching device adapted to receive an output from said switching device and output a latch output signal during a second time interval, said latch output signal related to a state of said switching device during said first time interval.

6. A bi-stable logic device as defined in claim 5 wherein said switching device comprises a field effect transistor, said first threshold magnitude includes a programmed gate threshold voltage of said field effect transistor, said second threshold magnitude includes an un-programmed gate threshold voltage of said field effect transistor, and said magnitude of said gate signal defines an electrical potential applied to a gate of said field effect transistor.

7. A bi-stable logic device as defined in claim 6 wherein said field effect transistor is an N-channel field effect transistor and said latching device comprises an inverter circuit having an input node coupled to a source terminal of said field effect transistor.

8. A bi-stable logic device as defined in claim 7 wherein said field effect transistor is a P-channel field effect transistor and said latching device comprises an inverter circuit having an input node coupled to drain terminal of said field effect transistor.

* * * * *

UNITED STATES PATENT AND TRADEMARK OFFICE
CERTIFICATE OF CORRECTION

PATENT NO. : 6,888,748 B2
DATED : May 3, 2005
INVENTOR(S) : Greg A. Blodgett

It is certified that error appears in the above-identified patent and that said Letters Patent is hereby corrected as shown below:

Title page,
Item [56], References Cited, OTHER PUBLICATIONS, "FET Programmable Read Only Memory" reference, "Disclosure Bull tin" should read -- Disclosure Bulletin --;

Column 1,
Line 27, "thousand ohms" should read -- thousands of ohms --;

Column 4,
Line 31, "produce" should read -- produces --;

Column 5,
Line 43, "input" should read -- output --.

Signed and Sealed this

Second Day of August, 2005

JON W. DUDAS
*Director of the United States Patent and Trademark Office*